United States Patent
Zhao et al.

(10) Patent No.: US 11,678,543 B2
(45) Date of Patent: Jun. 13, 2023

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Huihui Zhao, Wuhan (CN); Chenghao Bu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 335 days.

(21) Appl. No.: 17/264,811

(22) PCT Filed: Nov. 19, 2020

(86) PCT No.: PCT/CN2020/129981
§ 371 (c)(1),
(2) Date: Jan. 30, 2021

(87) PCT Pub. No.: WO2022/011911
PCT Pub. Date: Jan. 20, 2022

(65) Prior Publication Data
US 2022/0359637 A1    Nov. 10, 2022

(30) Foreign Application Priority Data
Jul. 17, 2020   (CN) .......................... 202010693758.3

(51) Int. Cl.
*H10K 59/131*   (2023.01)
*H01L 29/786*   (2006.01)

(52) U.S. Cl.
CPC ....... *H10K 59/131* (2023.02); *H01L 29/7869* (2013.01); *H01L 29/78651* (2013.01); *H10K 77/111* (2023.02); *H10K 2102/311* (2023.02)

(58) Field of Classification Search
CPC ............... H10K 59/131; H10K 77/111; H10K 2102/311; H10K 59/124; H10K 59/12;
(Continued)

(56) References Cited

U.S. PATENT DOCUMENTS

2017/0263887 A1   9/2017  Han
2019/0115407 A1*  4/2019  Cho .................... H01L 27/1218

FOREIGN PATENT DOCUMENTS

CN    109817675 A    5/2019
CN    110391252 A    10/2019
(Continued)

OTHER PUBLICATIONS

International Search Report in International application No. PCT/CN2020/129981, dated Apr. 16, 2021.
(Continued)

*Primary Examiner* — Kyoung Lee
(74) *Attorney, Agent, or Firm* — PV IP PC; Wei Te Chung; Zhigang Ma

(57) ABSTRACT

Embodiments of the present invention provide a display panel. The display panel includes a flexible substrate, wherein a first opening is provided at a bottom of the flexible substrate; a first inorganic layer; a first thin film transistor and a second thin film transistor, wherein the first thin film transistor includes a silicon semiconductor layer, and the second thin film transistor includes a metal oxide semiconductor layer and a second inorganic layer, wherein the second inorganic layer is provided with a second opening, and the second opening at least partially overlaps the first opening.

20 Claims, 4 Drawing Sheets

(58) Field of Classification Search
CPC ........... H01L 29/78651; H01L 29/7869; H01L 27/1255; H01L 29/78648; H01L 27/1225; H01L 27/1218; G09F 9/301
See application file for complete search history.

(56) References Cited

FOREIGN PATENT DOCUMENTS

| | | |
|---|---|---|
| CN | 110391276 A | 10/2019 |
| CN | 111785758 A | 10/2020 |

OTHER PUBLICATIONS

Written Opinion of the International Search Authority in International application No. PCT/CN2020/129981, dated Apr. 16, 2021.

* cited by examiner

DISPLAY PANEL AND DISPLAY DEVICE

RELATED APPLICATIONS

This application is a Notional Phase of PCT Patent Application No. PCT/CN2020/129981 having international filing date of Nov. 19, 2020, which claims the benefit of priority of Chinese Patent Application No. 202010693758.3 filed on Jul. 17, 2020. The contents of the above applications are all incorporated by reference as if fully set forth herein in their entirety.

FIELD OF INVENTION

The present invention relates to the technical field of display panels, in particular to a display panel and a display device.

BACKGROUND OF INVENTION

Low-temperature polycrystalline oxide (LTPO) refers to a low power consumption display technology. LTPO thin-film transistors (TFTs) require lower driving power than low-temperature poly-silicon (LTPS) TFTs. They are becoming more and more popular.

The current common LTPO products have a double-layer source and drain (SD) structure. For the double-layer SD structure, 17-18 masks are usually required in its manufacturing process. In the current manufacturing process, in order to enhance bending performance of a bending area, an inorganic layer in the bending area is generally bored twice to form an organic deep hole (ODH) and then the ODH is filled with organic materials, which requires high process precision and easily affects product yield.

Technical Problem

Embodiments of the present invention provide a display panel and a display device to improve product yield while ensuring bending performance of the bending area.

SUMMARY OF INVENTION

Embodiments of the present invention provide a display panel including a first area and a bendable second area connected to the first area, and the display panel includes: a flexible substrate, wherein a first opening is provided at a bottom of the flexible substrate, and the first opening is positioned in the second area; a first inorganic layer disposed on a side of the flexible substrate away from the first opening; a first thin film transistor and a second thin film transistor disposed on the first inorganic layer and positioned in the first area, wherein the first thin film transistor includes a silicon semiconductor layer, and the second thin film transistor includes a metal oxide semiconductor layer; a second inorganic layer disposed on the silicon semiconductor layer, wherein the second inorganic layer is provided with a second opening, the second opening is positioned in the second area, and the second opening at least partially overlaps the first opening; and an organic layer disposed on the first thin film transistor, the second thin film transistor, and the second inorganic layer, and the organic layer is positioned in the second opening.

According to one embodiment of the present invention, the second inorganic layer includes a first gate insulating layer disposed on the silicon semiconductor layer, and the second opening partially penetrates the first gate insulating layer.

According to one embodiment of the present invention, the display panel further includes a signal line positioned in the second opening, wherein a bottom end of the signal line is flush with a top end of the silicon semiconductor layer.

According to one embodiment of the present invention, the second inorganic layer further includes a second insulating layer disposed on the first gate insulating layer, a first interlayer dielectric layer disposed on the second insulating layer, a third gate insulating layer disposed on the first interlayer dielectric layer, and a second interlayer dielectric layer disposed on the third gate insulating layer; the first thin film transistor further includes a first gate positioned between the first gate insulating layer and the second insulating layer and corresponding to the silicon semiconductor layer, a first conductive layer positioned between the second insulating layer and the first interlayer dielectric layer and corresponding to the first gate, and a first source and a first drain connected to the silicon semiconductor layer; and the metal oxide semiconductor layer of the second thin film transistor is positioned between the first interlayer dielectric layer and the third gate insulating layer, the second thin film transistor further includes a third gate positioned between the second insulating layer and the first interlayer dielectric layer and corresponding to the metal oxide semiconductor layer, a fourth gate positioned between the third gate insulating layer and the second interlayer dielectric layer and corresponding to the metal oxide semiconductor layer, and a second source and a second drain connected to the metal oxide semiconductor layer, wherein the first source and the first drain, and the second source and the second drain are positioned in the same layer.

According to one embodiment of the present invention, a top end of the second opening away from the flexible substrate is greater than a bottom end of the second opening.

According to one embodiment of the present invention, the first opening is greater than or equal to the top end of the second opening, or the first opening is greater than or equal to the bottom end of the second opening and smaller than the top end of the second opening.

According to one embodiment of the present invention, a bottom end of the first opening away from the first inorganic layer is greater than a top end of the first opening.

According to one embodiment of the present invention, an inclination angle of the first opening is greater than an inclination angle of the second opening.

According to one embodiment of the present invention, a depth of a center part of the first opening is greater than a depth of a surrounding part of the first opening, and the center part overlaps the bottom end of the second opening.

According to one embodiment of the present invention, a plurality of the first openings are provided, and the plurality of first openings are arranged on the flexible substrate at intervals.

According to one embodiment of the present invention, a depth of the first opening in the central part is greater than a depth of the first opening in the surrounding part; or a width of the first opening in a central part is greater than a width of the first opening in a surrounding part; or a distribution density of the plurality of first openings in the central part is greater than a distribution density of the plurality of first openings in the surrounding part.

According to one embodiment of the present invention, a depth of the second opening ranges from 1.1 μm to 1.4 μm, and an inclination angle of the second opening ranges from 30° to 60°.

According to one embodiment of the present invention, the second opening does not penetrate the first inorganic layer.

According to one embodiment of the present invention, the first opening and the second opening are symmetrical.

According to one embodiment of the present invention, the flexible substrate includes a first flexible substrate, a second flexible substrate disposed on the first flexible substrate, and a carrier layer positioned between the first flexible substrate and the second flexible substrate, a symmetry plane of the first opening and the second opening is positioned between a plane at ⅓ of a thickness of the second flexible substrate and a plane at ½ of the thickness of the second flexible substrate, the first opening is provided at a bottom of the first flexible substrate.

According to one embodiment of the present invention, the second opening includes a first opening part away from the flexible substrate and a second opening part connected to the first opening part and closes to the flexible substrate, the first opening part and the second opening part are symmetrically arranged, and a top end of the first opening part away from the flexible substrate is greater than a bottom end of the first opening part.

An embodiment of the present invention provides a display device including the above-mentioned display panel.

Beneficial Effect

In a display panel and a display device provided by embodiments of the present invention, the second opening is provided in the second inorganic layer on the silicon semiconductor layer. In addition, the flexible substrate is provided with the first opening corresponding to the second opening, so as to ensure bending performance of the bending area and improve product yield.

DESCRIPTION OF DRAWINGS

Specific embodiments of the present invention will be described in detail with reference to the drawings to make the technical solutions and other beneficial effects of the invention easy to understand.

DETAILED DESCRIPTION OF PREFERRED EMBODIMENTS

Figure 1:
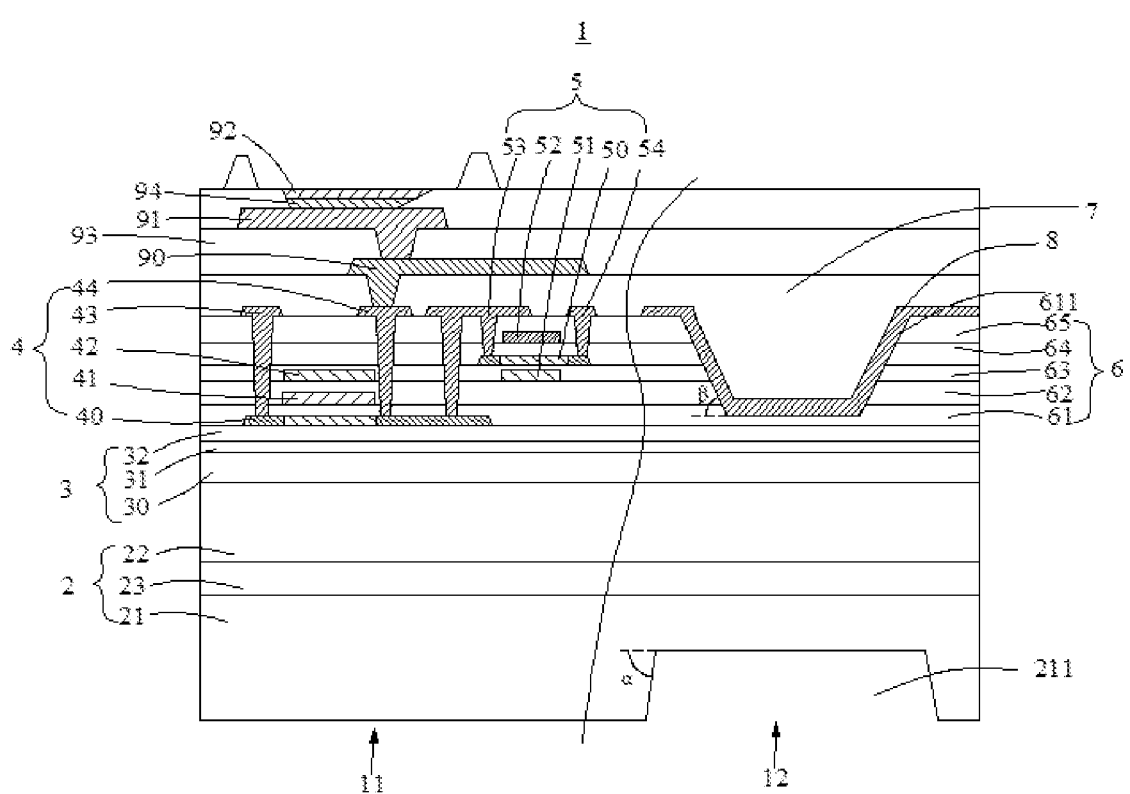
FIG. 1 is a schematic cross-sectional view of a display panel provided by an embodiment of the invention.

The technical solutions in the embodiments of the present application will be clearly and completely described below with reference to the drawings in the embodiments of the present application. Obviously, the described embodiments are only a part of the embodiments of the present application, rather than all the embodiments. Based on the embodiments in the present application, all other embodiments obtained by those skilled in the art without doing creative work fall within the protection scope of this application.

In the description of the present application, it should be understood that the orientation or positional relationship indicated by the terms "center", "longitudinal", "lateral", "length", "width", "thickness", "above", "below", "front", "back", "left", "right", "upright", "horizontal", "top", "bottom", "inner", "outer", "clockwise", "counterclockwise", etc. are based on the orientation or positional relationship shown in the drawings. It is only for the convenience of describing the application and simplifying the description, rather than indicating or implying that the device or element referred to must have a specific orientation, be constructed and operated in a specific orientation, and therefore cannot be understood as a limitation of the application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise specifically defined.

In the description of the present application, it should be noted that the terms "installation", "connected to", or "connection" should be understood in a broad sense, unless otherwise specified and limited. For example, it can be a fixed connection, a detachable connection, or an integral connection. It can be mechanically connected, electrically connected, or can be communicated with each other. It can be directly connected or indirectly connected through an intermediary. It can be a communication between two elements or an interaction relationship between two elements. For those of ordinary skill in the art, the specific meanings of the above terms in the application can be understood according to specific circumstances.

In the present invention, unless expressly stipulated and defined otherwise, the first feature above or below the second feature may include direct contact between the first feature and second feature. It may also be included that the first feature and second feature are not in direct contact but in contact with another feature between them. Moreover, the first feature is above the second feature means the first feature being directly above and obliquely above the second feature, or it simply means that a horizontal height of the first feature is higher than that of the second feature. The first feature is below the second feature means the first feature directly below and obliquely below the second feature, or it simply means that a horizontal height of the first feature is lower than that of the second feature.

The following disclosure provides various embodiments or examples for realizing various structures of the present application. To simplify the disclosure of the present application, the components and configures of specific examples are described below. No doubt, they are only examples and are not intended to limit the application. Further, the present invention may repeat reference numerals and/or reference letters in different examples, and this repetition is for the purpose of simplification and clarity, and does not indicate the relationship between the various embodiments and/or configures discussed. In addition, this application provides examples of various specific processes and materials, but those of ordinary skill in the art may be aware of the application of other processes and/or the use of other materials.

The invention will be further described below with reference to the drawings and embodiments.

As shown in FIG. 1, an embodiment of the present invention provides a display panel 1, including a first area 11 and a bendable second area 12 connected to the first area 11. The second area 12 is used to bend to the back of the display panel to narrow the bottom bezel. The display panel 1 includes a flexible substrate 2, a first inorganic layer 3, a first thin film transistor 4 and a second thin film transistor 5, a second inorganic layer 6, and an organic layer 7. Alternatively, the display panel 1 is an organic light-emitting diode (OLED) display panel, the first area 11 is a display area, and the second area 12 is a non-display area.

The bottom of the flexible substrate 2 is provided with a first opening 211, and the first opening 211 is positioned in the second area 12. Alternatively, the flexible substrate 2 includes a single-layer structure or a multi-layer structure.

The first inorganic layer 3 is positioned on a side of the flexible substrate 2 away from the first opening 211.

The first thin film transistor 4 and the second thin film transistor 5 are positioned on the first inorganic layer 3 and positioned in the first area 11. Wherein, the first thin film transistor 4 includes a silicon semiconductor layer 40 and the second thin film transistor 5 includes a metal oxide semiconductor layer 50. Alternatively, the material of the silicon semiconductor layer 40 includes monocrystalline silicon or low-temperature polycrystalline silicon, and the material of the metal oxide semiconductor layer 50 includes indium gallium zinc oxide (IGZO) or zinc oxide (ZnO).

The second inorganic layer 6 is positioned on the silicon semiconductor layer 40. The second inorganic layer 6 is provided with a second opening 611, the second opening 611 is positioned in the second region 12, and the second opening 611 at least partially overlaps the first opening 211.

The organic layer 7 is positioned on the first thin film transistor 4, the second thin film transistor 5, and the second inorganic layer 6. The organic layer 7 extends from the first area 11 to the second area 12 and is positioned in the second opening 611.

In the display panel 1 provided by the embodiment of the present invention, the first inorganic layer 3 and the second inorganic layer 6 are respectively disposed on both sides of the silicon semiconductor layer of the first thin film transistor 4. The second opening 611 is provided in the second inorganic layer 6, and compared with the prior art forming two second openings in the first inorganic layer and the second inorganic layer, this design can reduce the complexity of a process for forming the second opening. In addition, the flexible substrate 2 is provided with the first opening 211 corresponding to the second opening 611, and the second opening 611 is filled with a more flexible organic layer so that the product yield can be improved while ensuring bending performance of a bending area.

In one embodiment, please refer to FIG. 1, the second opening 611 does not penetrate the first inorganic layer 3. The first inorganic layer 3 includes a buffer layer 30, a silicon nitride layer 31 on the buffer layer 30, and a silicon oxide layer 32 on the silicon nitride layer 31. A thickness of the buffer layer 30 ranges from 400 nm to 600 nm; a thickness of the silicon nitride layer 31 ranges from 40 nm to 60 nm; and a thickness of the silicon oxide layer 32 ranges from 200 nm to 400 nm. In other embodiments, the first inorganic layer 3 may only include a two-layer structure, such as a silicon nitride layer 31 and a silicon oxide layer 32. In this way, one ODH mask can be saved, and water vapor can be prevented from intruding into the first area 11 from the second area 12 to avoid OLED failure due to water vapor intrusion, thereby improving product yield.

The second inorganic layer 6 may have a single-layer structure or a multilayer structure. Specifically, the second inorganic layer 6 in the embodiment includes a multilayer structure. The second inorganic layer 6 includes a first gate insulating layer 61 on the silicon semiconductor layer 40, and the second opening 611 at least partially penetrates the first gate insulating layer 61. Alternatively, the second opening 611 partially penetrates the first gate insulating layer 61, and a thickness of the first gate insulating layer 61 under the second opening 611 ranges from 1 nm to 50 nm. In this way, the remaining first gate insulating layer 61 can prevent water vapor from intruding into the first region 11 from the second region 12 and can prevent the first inorganic layer 3 from being damaged in subsequent manufacturing processes.

Alternatively, the display panel 1 further includes a signal line 8 positioned in the second opening 611, and a bottom end of the signal line 8 is flush with a top end of the silicon semiconductor layer 40. Alternatively, the signal line 8 extends along part or all of the inner wall of the second opening 611.

Alternatively, the second inorganic layer 6 further includes a second insulating layer 62 on the first gate insulating layer 61, a first interlayer dielectric layer 63 on the second insulating layer 62, a third gate insulating layer 64 on the first interlayer dielectric layer 63, and a second interlayer dielectric layer 65 on the third gate insulating layer 64.

The first thin film transistor 4 further includes a first gate 41 positioned between the first gate insulating layer 61 and the second insulating layer 62 and corresponding to the silicon semiconductor layer 40, a first conductive layer 42 positioned between the second insulating layer 62 and the first interlayer dielectric layer 63 and corresponding to the first gate 41, and a first source 43 and a first drain 44 connected to the silicon semiconductor layer 40; wherein, the first conductive layer 42 can form a capacitor with the first gate 41. The metal oxide semiconductor layer 50 of the second thin film transistor 5 is positioned between the first interlayer dielectric layer 63 and the third gate insulating layer 64. The second thin film transistor 5 further includes a third gate 51 positioned between the second insulating layer 62 and the first interlayer dielectric layer 63 and corresponding to the metal oxide semiconductor layer 50, a fourth gate 52 positioned between the third gate insulating layer 64 and the second interlayer dielectric layer 65 and corresponding to the metal oxide semiconductor layer 50, and a second source 53 and a second drain 54 connected to the metal oxide semiconductor layer 50, wherein, the first source and the first drain, and the second source and the second drain are positioned in the same layer. Wherein, the second opening 611 penetrates the second insulating layer 62, the first interlayer dielectric layer 63, the third gate insulating layer 64, the second interlayer dielectric layer 65 and at least part of the first gate insulating layer 61. The depth of the second opening 611 ranges from 1.1 μm to 1.4 μm. The first source 43 and the first drain 44 and the second source 53 and the second drain 54 are in the same layer.

In one embodiment, a top area of the second opening 611 away from the flexible substrate 2 is larger than a bottom area of the second opening 611. In this way, the boring process is convenient to carry out; the bendability is good; and the signal line 8 extending along an inner wall of the opening 611 is not easy to break.

Alternatively, an area of the first opening 211 is larger than or equal to the top area of the second opening 611, or the area of the first opening 211 is larger than or equal to the bottom area of the second opening 611 and smaller than the top area of the second opening 611.

Alternatively, a bottom area of the first opening 211 away from the first inorganic layer 3 is larger than a top area of the first opening 211. In this way, the bending axis can be restricted within a limited range of the first opening 211, which ensures the stability of bending.

Alternatively, an inclination angle α of the first opening 211 is greater than an inclination angle β of the second opening 611. The inclination angle α of the first opening refers to the angle formed by a sidewall of the first opening 211 and the flexible substrate 2 where the first opening 211 is not provided in the cross-sectional view. The inclination angle β of the second openings refers to the angle formed by a sidewall of the second opening 611 and the first gate insulating layer 61 where the second opening 611 is not provided in a cross-sectional view. Alternatively, the inclination angle β of the second opening 611 ranges from 30° to 60°, and the inclination angle α of the first opening 211 is an acute angle greater than 30°, such as 45°, 60°, or 85°. In this way, it can be ensured that the bending axis is limited within the range defined by the first opening 211, which ensures the stability of bending.

Alternatively, a depth of a center portion of the first opening 211 is greater than a depth of a surrounding portion of the first opening 211, wherein the center portion overlaps the bottom of the second opening 611. In this way, it can be ensured that the bending axis is limited within a range defined by the bottom of the second opening 611.

Figure 2:
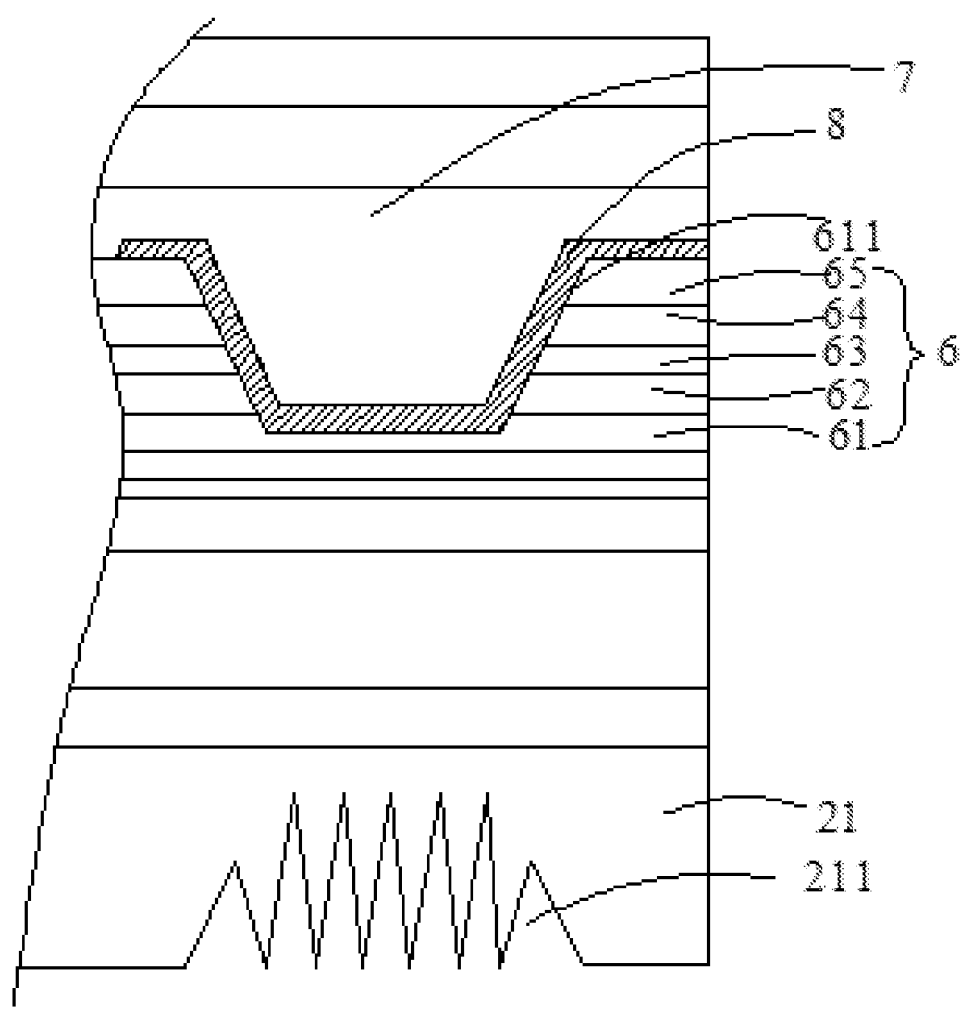
FIG. 2 is a schematic cross-sectional view of a second area of a display panel provided by an embodiment of the invention.

Alternatively, please refer to FIG. 2, a plurality of the first openings 211 are provided, and the plurality of first openings 211 are arranged on the flexible substrate 2 at intervals. That is, the bottom of the flexible substrate 2 may be patterned to form a plurality of openings.

Alternatively, a depth of the first opening 211 in the central portion is greater than a depth of the first opening 211 in the surrounding portion; or a width of the first opening 211 in the central portion is greater than a width of the first opening 211 in a surrounding portion; or a distribution density of the plurality of first openings 211 in the central portion is greater than a distribution density of the plurality of first openings 211 in the surrounding portion. Wherein, the plurality of the first openings 211 positioned in the central portion overlaps the bottom of the second opening 611. In this way, it can be ensured that the bending axis is limited within the range defined by the bottom of the second opening 611.

Figure 3:
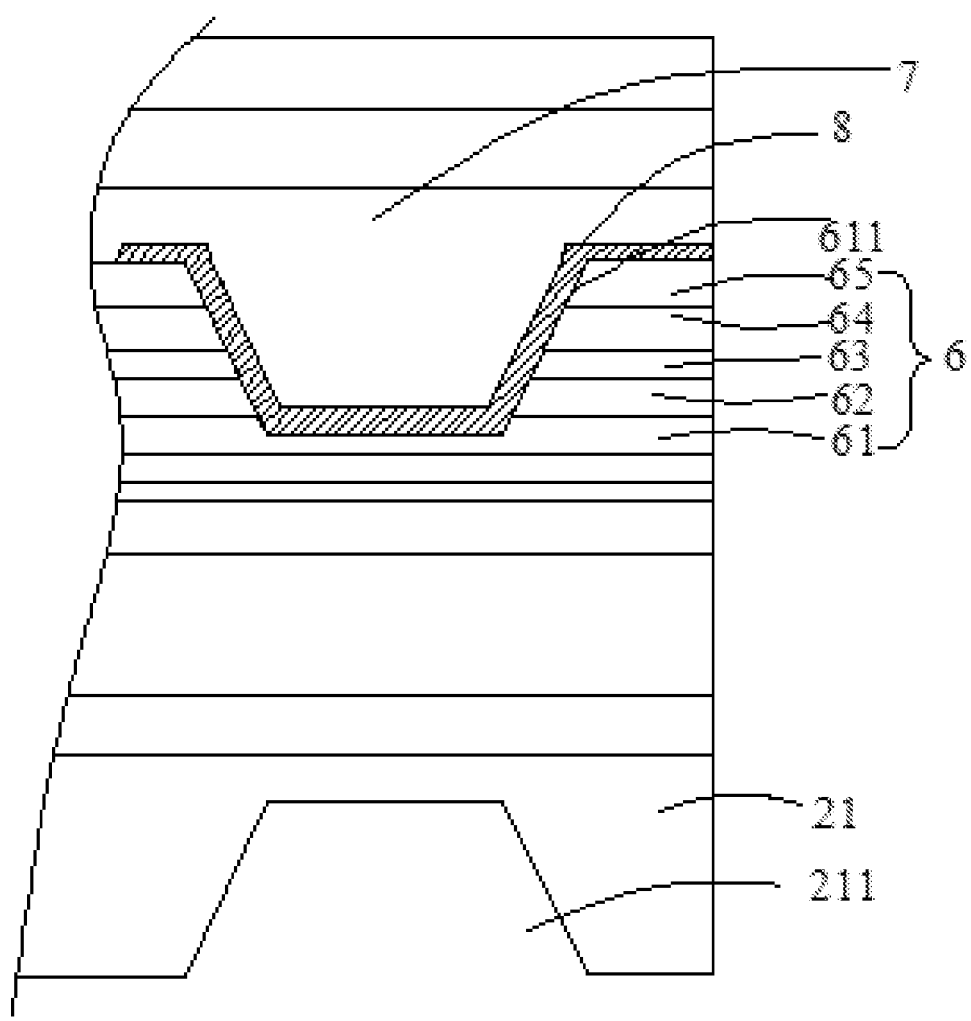
FIG. 3 is a schematic cross-sectional view of a second area of a display panel provided by an embodiment of the invention.

In one embodiment, please refer to FIG. 3, the first opening 211 and the second opening 611 are symmetrical in a horizontal direction. That is, an extension line of the sidewall of the first opening 211 and an extension line of the sidewall of the second opening 611 are in a straight line.

Alternatively, the flexible substrate 2 includes a first flexible substrate 21, a second flexible substrate 22 positioned on the first flexible substrate 21, and a carrier layer 23 positioned between the first flexible substrate 21 and the second flexible substrate 22. The symmetry plane of the first opening 211 and the second opening 611 is positioned between a plane at ⅓ the thickness of the second flexible substrate 22 and a plane at ½ the thickness of the second flexible substrate 22. The first opening 211 is provided at the bottom of the first flexible substrate 21. Alternatively, the first flexible substrate 21 is thicker than the second flexible substrate 22, and a thickness of the first flexible substrate 21 where the first opening 211 is not provided ranges from 3 μm to 10 μm. A thickness of the first flexible substrate 21 on the first opening 211 ranges from 1 μm to 5 μm. In this way, a neutral plane (a plane with zero stress) can be close to or positioned on the signal line 8.

Figure 4:
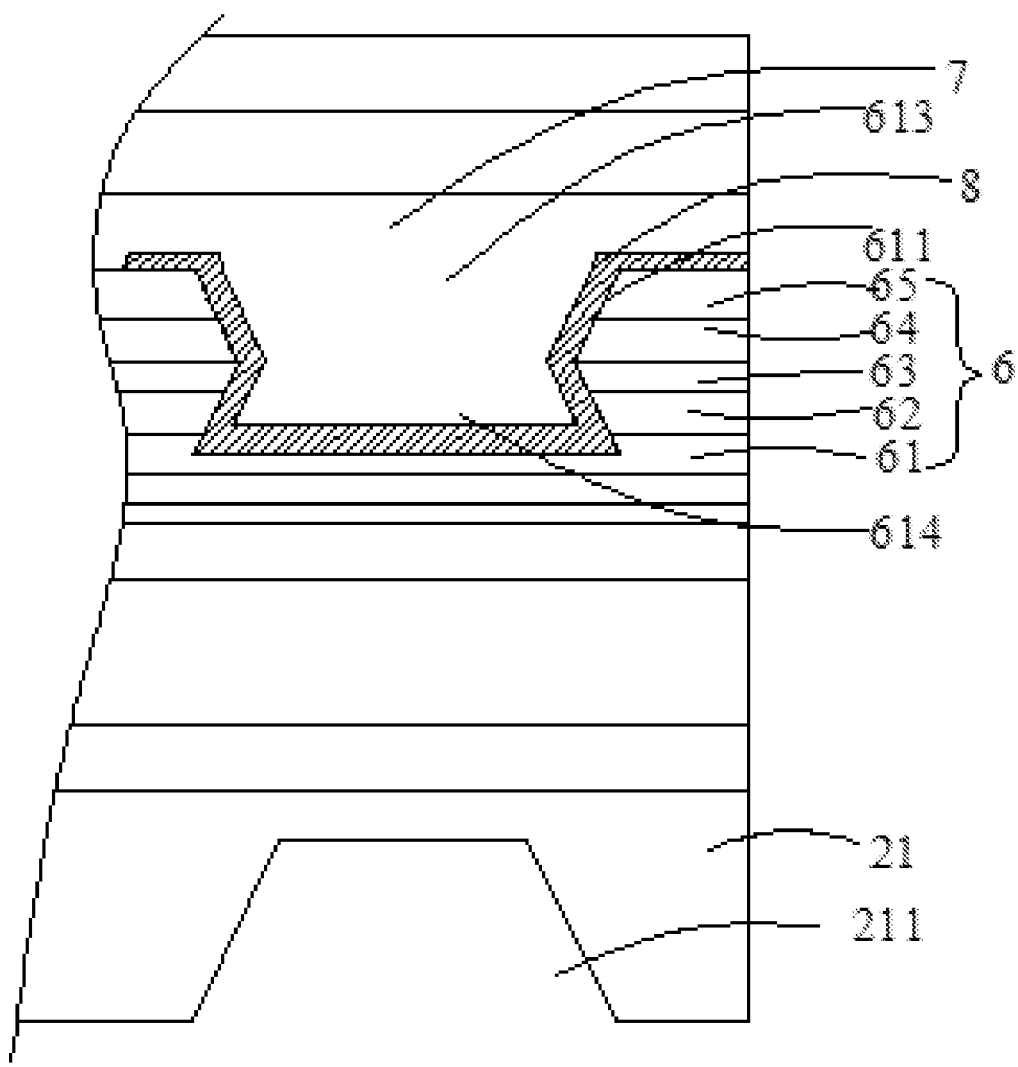
FIG. 4 is a schematic cross-sectional view of a second area of a display panel provided by an embodiment of the invention.

In one embodiment, please refer to FIG. 4, the second opening 611 includes a first opening part 613 away from the flexible substrate 2 and a second opening part 614 connected to the first opening part 613 and close to the flexible substrate 2. The first opening part 613 and the second opening part 614 are symmetrically arranged, and a top end of the first opening part 613 away from the flexible substrate 2 is larger than a bottom end of the first opening part 613. Alternatively, the first opening part 613 and the second opening part 614 are symmetrical in a horizontal direction, and they are formed by a mask. In this way, the boring process can be facilitated; the bending axis can be restricted within the limited range of the second opening 611, and the stability of bending can be ensured.

In one embodiment, the organic layer 7 is continuous and includes a first part positioned in the first area 11 and a second part positioned in the second area 12, and the second part is positioned in the second opening 611 and covers the signal line 8.

In one embodiment, the display panel 1 further includes a second metal layer 90 on the organic layer 7, a second organic layer 93 on the second metal layer 90, and a light-emitting layer. The light-emitting layer includes a first electrode 91, a second electrode 92 positioned on the first electrode 91, and a light-emitting material 94 positioned between the first electrode 91 and the second electrode 92. The first electrode 91 is electrically connected to the first drain electrode 44 of the first thin film transistor 4 through the second metal layer 90.

In the display panel 1 provided by the embodiment of the present invention, the first inorganic layer 3 and the second inorganic layer 6 are respectively disposed on both sides of the silicon semiconductor layer of the first thin film transistor 4. The second opening 611 is provided in the second inorganic layer 6, and compared with the prior art forming two second openings in the first inorganic layer and the second inorganic layer, the process complexity of forming the second openings can be reduced. In addition, the flexible substrate 2 is provided with the first opening 211 corresponding to the second opening 611, and the second opening 611 is filled with a more flexible organic layer. Thus, the product yield can be improved while ensuring bending performance of the bending area.

An embodiment of the invention further provides a display device including the display panel 1 as described above. The display device may be a product or a component with display function, such as a display module; a fixed terminal such as a desktop computer; a television; a mobile terminal such as a smartphone or a personal digital assistant; or a wearable device such as a smartwatch or a head-mounted device.

The embodiments of the present invention are described in detail above, and specific examples are used in this article to illustrate the principle and implementation of the invention. The descriptions of the above embodiments are only used to help understand the technical solutions and core ideas of the invention. Those of ordinary skill in the art should understand that they can still modify the technical solutions recorded in the foregoing embodiments, or equivalently replace some of the technical features. These modifications or replacements do not cause the essence of the corresponding technical solutions to deviate from the scope of the technical solutions of the embodiments of the present invention.

What is claimed is:

1. A display panel, comprising a first area and a bendable second area connected to the first area, the display panel further comprising:
 a flexible substrate, wherein a first opening is provided at a bottom of the flexible substrate, and the first opening is positioned in the second area;
 a first inorganic layer disposed on a side of the flexible substrate away from the first opening;
 a first thin film transistor and a second thin film transistor disposed on the first inorganic layer and positioned in the first area, wherein the first thin film transistor comprises a silicon semiconductor layer, and the second thin film transistor comprises a metal oxide semiconductor layer;
 a second inorganic layer disposed on the silicon semiconductor layer, wherein the second inorganic layer is provided with a second opening, the second opening is positioned in the second area, and the second opening at least partially overlaps the first opening; and
 an organic layer disposed on the first thin film transistor, the second thin film transistor, and the second inorganic layer, and the organic layer is positioned in the second opening.

2. The display panel according to claim 1, wherein the second inorganic layer comprises a first gate insulating layer disposed on the silicon semiconductor layer, and the second opening partially penetrates the first gate insulating layer.

3. The display panel according to claim 2, further comprising a signal line positioned in the second opening, wherein a bottom end of the signal line is flush with a top end of the silicon semiconductor layer.

4. The display panel according to claim 3, wherein the second inorganic layer further comprises a second insulating layer disposed on the first gate insulating layer, a first interlayer dielectric layer disposed on the second insulating layer, a third gate insulating layer disposed on the first interlayer dielectric layer, and a second interlayer dielectric layer disposed on the third gate insulating layer;
 the first thin film transistor further comprises a first gate positioned between the first gate insulating layer and the second insulating layer and corresponding to the silicon semiconductor layer, a first conductive layer positioned between the second insulating layer and the first interlayer dielectric layer and corresponding to the first gate, and a first source and a first drain connected to the silicon semiconductor layer; and
 the metal oxide semiconductor layer of the second thin film transistor is positioned between the first interlayer dielectric layer and the third gate insulating layer; the second thin film transistor further comprises a third gate positioned between the second insulating layer and the first interlayer dielectric layer and corresponding to the metal oxide semiconductor layer, a fourth gate positioned between the third gate insulating layer and the second interlayer dielectric layer and corresponding to the metal oxide semiconductor layer, and a second source and a second drain connected to the metal oxide semiconductor layer, wherein the first source and the first drain and the second source and the second drain are positioned in same layer.

5. The display panel according to claim 1, wherein a top end of the second opening away from the flexible substrate is larger than a bottom end of the second opening.

6. The display panel according to claim 5, wherein the first opening is larger than or equal to the top end of the second opening, or the first opening is larger than or equal to the bottom end of the second opening and smaller than the top end of the second opening.

7. The display panel according to claim 5, wherein a bottom end of the first opening away from the first inorganic layer is larger than a top end of the first opening.

8. The display panel according to claim 7, wherein an inclination angle of the first opening is greater than an inclination angle of the second opening.

9. The display panel according to claim 5, wherein a depth of a center part of the first opening is greater than a depth of a surrounding part of the first opening, and the center part overlaps the bottom end of the second opening.

10. The display panel according to claim 5, wherein a plurality of the first openings are provided, and the plurality of first openings are arranged on the flexible substrate at intervals.

11. The display panel according to claim 10, wherein a depth of the first opening in the central part is greater than a depth of the first opening in the surrounding part; or a width of the first opening in a central part is greater than a width of the first opening in a surrounding part; or a distribution density of the plurality of first openings in the central part is greater than a distribution density of the plurality of first openings in the surrounding part.

12. The display panel according to claim 5, wherein a depth of the second opening ranges from 1.1 µm to 1.4 µm, and an inclination angle of the second opening ranges from 30° to 60°.

13. The display panel according to claim 1, wherein the second opening does not penetrate the first inorganic layer.

14. The display panel according to claim 1, wherein the first opening and the second opening are symmetrical.

15. The display panel according to claim 14, wherein the flexible substrate comprises a first flexible substrate, a second flexible substrate disposed on the first flexible substrate, and a carrier layer positioned between the first flexible substrate and the second flexible substrate; a symmetry plane of the first opening and the second opening is positioned between a plane at ⅓ of a thickness of the second flexible substrate and a plane at ½ of the thickness of the second flexible substrate; and the first opening is provided at a bottom of the first flexible substrate.

16. The display panel according to claim 1, wherein the second opening comprises a first opening part away from the flexible substrate and a second opening part connected to the first opening part and close to the flexible substrate; the first opening part and the second opening part are symmetrically arranged; and a top end of the first opening part away from the flexible substrate is larger than a bottom end of the first opening part.

17. A display device, comprising a display panel, the display panel comprising a first area and a bendable second area connected to the first area, the display panel comprising:
 a flexible substrate, wherein a first opening is provided at a bottom of the flexible substrate, and the first opening is positioned in the second area;
 a first inorganic layer disposed on a side of the flexible substrate away from the first opening;
 a first thin film transistor and a second thin film transistor disposed on the first inorganic layer and positioned in the first area, wherein the first thin film transistor comprises a silicon semiconductor layer, and the second thin film transistor comprises a metal oxide semiconductor layer;
 a second inorganic layer disposed on the silicon semiconductor layer, wherein the second inorganic layer is provided with a second opening, the second opening is positioned in the second area, and the second opening at least partially overlaps the first opening; and an organic layer disposed on the first thin film transistor, the second thin film transistor, and the second inorganic layer; and the organic layer is positioned in the second opening.

18. The display device according to claim 17, wherein the second opening does not penetrate the first inorganic layer.

19. The display device according to claim 17, wherein a top end of the second opening away from the flexible substrate is larger than a bottom end of the second opening.

20. The display device according to claim 17, wherein the first opening and the second opening are symmetrical.

* * * * *